United States Patent [19]

Edelman

[11] Patent Number: 5,321,780
[45] Date of Patent: Jun. 14, 1994

[54] OPTICAL DIGITAL MEMORY SYSTEM

[76] Inventor: Seymour Edelman, 9115 Glenridge Rd., Silver Spring, Md. 20910

[21] Appl. No.: 986,694

[22] Filed: Dec. 8, 1992

Related U.S. Application Data

[63] Continuation-in-part of Ser. No. 846,082, Mar. 3, 1992, abandoned.

[51] Int. Cl.$^5$ .............................................. G02B 6/28
[52] U.S. Cl. .................................................... 385/15
[58] Field of Search .................. 250/227.11; 359/110, 359/113; 385/15, 16, 24, 27, 31

[56] References Cited

U.S. PATENT DOCUMENTS

| 3,042,912 | 7/1962  | Gilbert          | 340/347   |
|-----------|---------|------------------|-----------|
| 3,322,482 | 5/1967  | Harmon           | 350/267   |
| 3,432,675 | 3/1969  | Roby             | 250/219   |
| 3,492,493 | 1/1970  | Herriott         | 350/160   |
| 3,526,880 | 9/1970  | Filippazzi       | 340/173   |
| 3,543,248 | 11/1970 | Oliver           | 340/173   |
| 3,728,521 | 4/1973  | Borough          | 250/227   |
| 3,985,423 | 11/1976 | Tseng            | 350/96.10 |
| 4,362,358 | 12/1982 | Hafle            | 350/96.16 |
| 4,647,765 | 3/1987  | Imaizumi et al.  | 250/227   |
| 4,680,809 | 7/1987  | Hartkopf et al.  | 455/601   |
| 4,957,340 | 9/1990  | Kirkby           | 385/15 X  |
| 4,962,986 | 10/1990 | Hompel           | 350/96.15 |
| 5,043,976 | 8/1991  | Abiven et al.    | 385/15 X  |

OTHER PUBLICATIONS

*Liquid Crystals*, "Nature's Delicate Phase of Matter", Peter J. Collings, Princeton Univ. Press, Princeton, N.J., 1990, pp. 69-70 and 115-117.
*Optical-Fiber Telecommunications II*, "Light-Emitting Diodes for Telecommunications", Chap. 12. Tien Pei Lee et al, pp. 467-469, 509, 528-531.
*Optoelectronics-An introduction*, Sec. Ed., J. Wilson et al, Prentice Hall, 1989, pp. 144-148.
*Liquid Crystals & Plastic Crystals*, vol. 2, Gray & Winsor, Halstead Press, 1974, Chapter 2-Optical Properties of Liquid Crystals, pp. 24-61.
*Applied Physics Letter*, vol. 36, No. 11, Jun. 1, 1980, "Submicro-second Bistable Electro-optic Switching In Liquid Crystals", Noel A. Clark et al. pp. 899-901.
*Electronics Letters*, Jan. 2, 1992, vol. 28, No. 1, "Programmable Binary Phase-Only Optical Device Based on Ferroelectric Liquid Crystal SLM", S. E. Broomfield et al., pp. 26-28.
*Applied Physics Letter*, 47 (12), Dec. 15, 1985, "Room-Temperature Switching Behavior of Ferroelectric Liquid Crystals in Thin Cells", J. S. Patel, pp. 1277-1279.

*Primary Examiner*—Akm E. Ullah
*Attorney, Agent, or Firm*—Birch, Stewart, Kolasch & Birch

[57] ABSTRACT

An optical memory having a light valve for each memory bit. Each bit is programmed in a WRITE mode to pass or inhibit optical energy emitted from a local source of illumination and thus store a binary value of "1" or "0". A short length of optical fiber guides light from the light valve in a READ mode to the core of a transmission fiber which acts as a series transmission line for an optical pulse sequence when each of a plurality of the light valves is illuminated by a respective optical source, e.g., a light emitting diode. An optical energy absorbing termination is located at one end of the series transmission fiber while an optical amplifier device is located at the opposite or output end and, where necessary in between, with the amplified pulse sequence from the transmission fiber being thereafter coupled to one or more individual optical receiver and transducer units which generate respective corresponding electrical utilization signals.

23 Claims, 12 Drawing Sheets

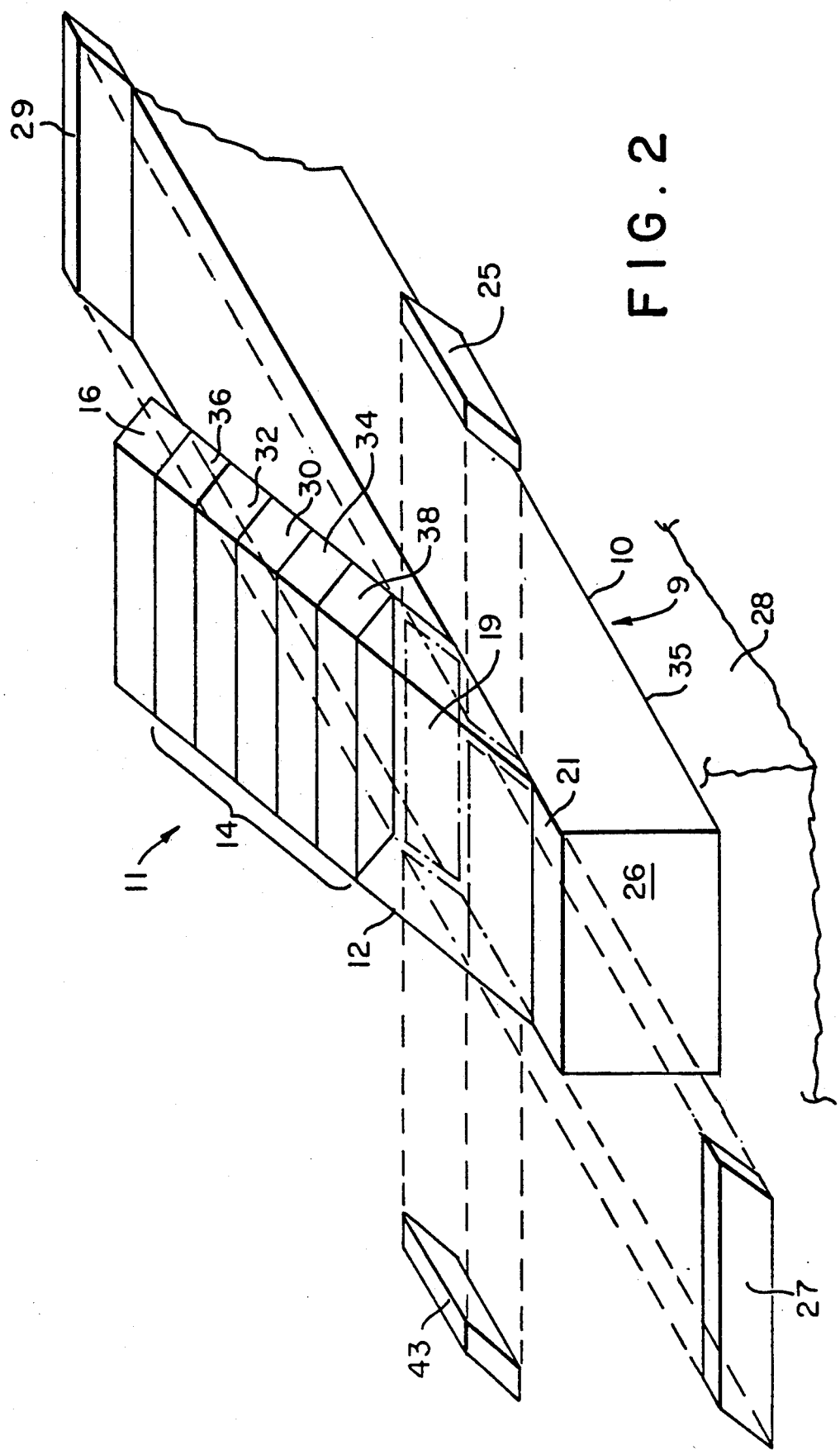

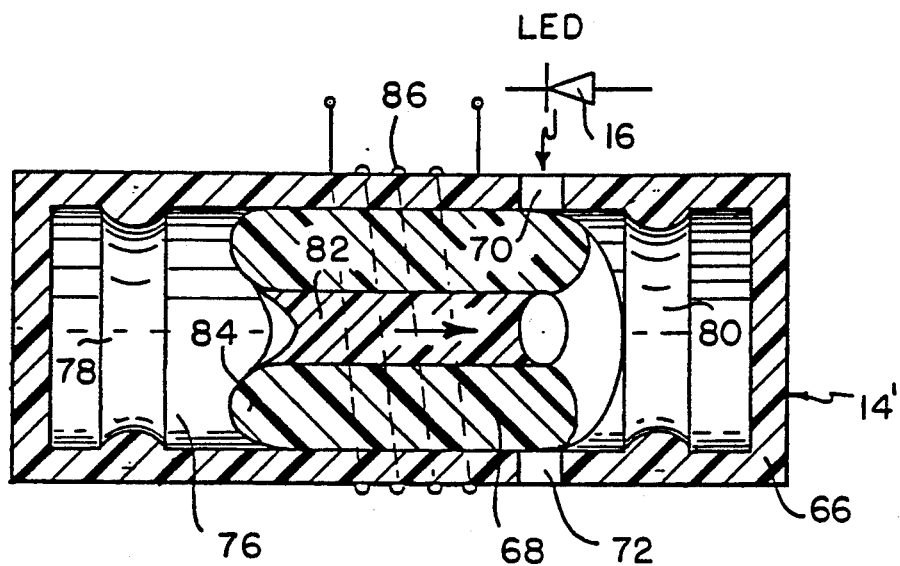
FIG. 16
FIG. 17
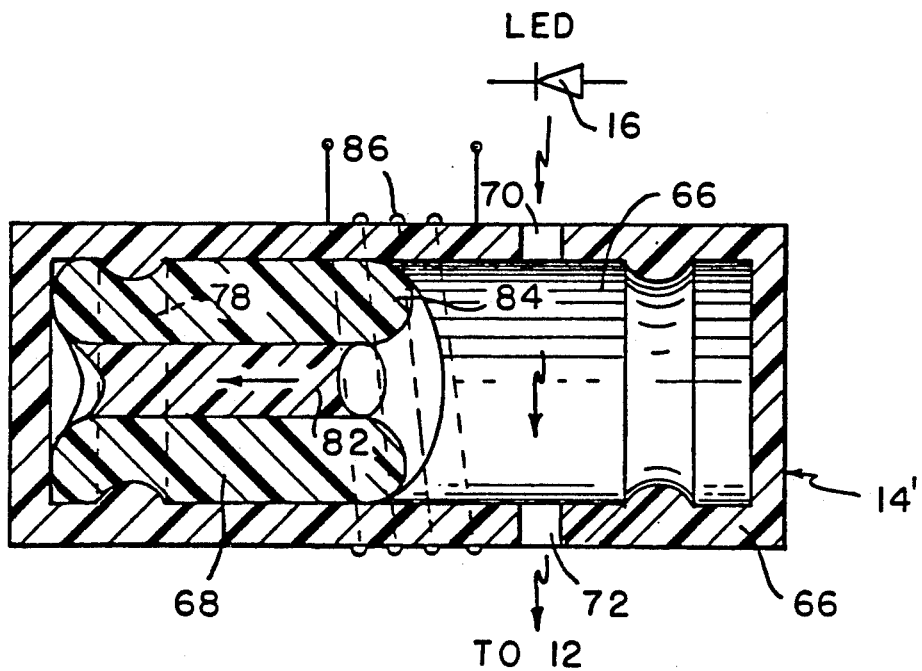

OPTICAL DIGITAL MEMORY SYSTEM

This is a continuation-in-part application of prior copending U.S. Ser. No. 07/846,082 filed by the present inventor on Mar. 3, 1992, the contents of which are hereby incorporated by reference, and now abandoned as of the filing date of this application.

BACKGROUND OF THE INVENTION

This invention relates generally to digital memory systems and more particularly to an electro-mechanically stored and optically retrieved memory system.

Digital memory systems are generally known and heretofore typically have used magnetic disks or tapes as a storage medium. Because the disks are required to rotate and the tape must be wound and unwound to access information, the average time required to access a desired piece of information can be found to be excessively long for a particular application. Recently with the development of optical disk type systems using compact disks, the information is optically stored in binary form; that is, the information is coded as a sequence of optically generated 0's and 1's, which are represented by a sequence comprised of pulses of light. For example, the absence of a pulse represents a digital "0", while the presence of light pulse represents a digital "1". While such apparatus operates very well there is an on-going need and search for economical devices and systems which provide faster access times and increased density of data storage.

It is an object of the present invention, therefore, to provide an improvement in digital memories.

It is a further object of the invention to provide an improvement in optical type digital memories.

And it is yet a further object of the present invention to provide an optically retrieved memory having improved access time for retrieving a desired piece of information.

SUMMARY

Briefly, the foregoing and other objects of the invention are achieved by a bistable light valve for each memory bit which is programmed in a WRITE mode to pass or inhibit optical energy emitted from a respective light source and thus store a binary value of "1" or "0". An optical energy guide or coupler guides light from the light valve in a READ mode to the core of a cladded transmission fiber or one with a thin outer metallic reflecting layer which acts as a series transmission line for an optical pulse sequence when each of a plurality of the light valves is illuminated with optical energy from its respective optical source. The optical coupler is implemented, for example, in one embodiment by a nematic liquid crystal and, in another embodiment, by a short length of optical fiber guide. The light valve also takes several forms, such as a liquid crystal light cell, an electromagnetic shutter type device, and/or Pockel's and Kerr cells. An optical energy absorbing termination is located at one end of the transmission fiber while optical amplifier means are located at the opposite or output end of the transmission line and where needed within the line, with the amplified pulse sequence from the transmission fiber being thereafter coupled to one or more individual optical receiver and transducer units which generate respective corresponding electrical utilization signals.

BRIEF DESCRIPTION OF THE DRAWINGS

The following detailed description of the invention will be more readily understood when considered together with the accompanying drawings in which:

FIG. 2 is an exploded perspective view partially illustrative of the preferred embodiment of the optical coupler and optical transmission line shown in FIG. 1;

FIGS. 16 and 17 are central longitudinal cross sections of the bistable light valve shown in FIG. 15 and illustrative of its operation;

DETAILED DESCRIPTION OF THE INVENTION

Figure 1:
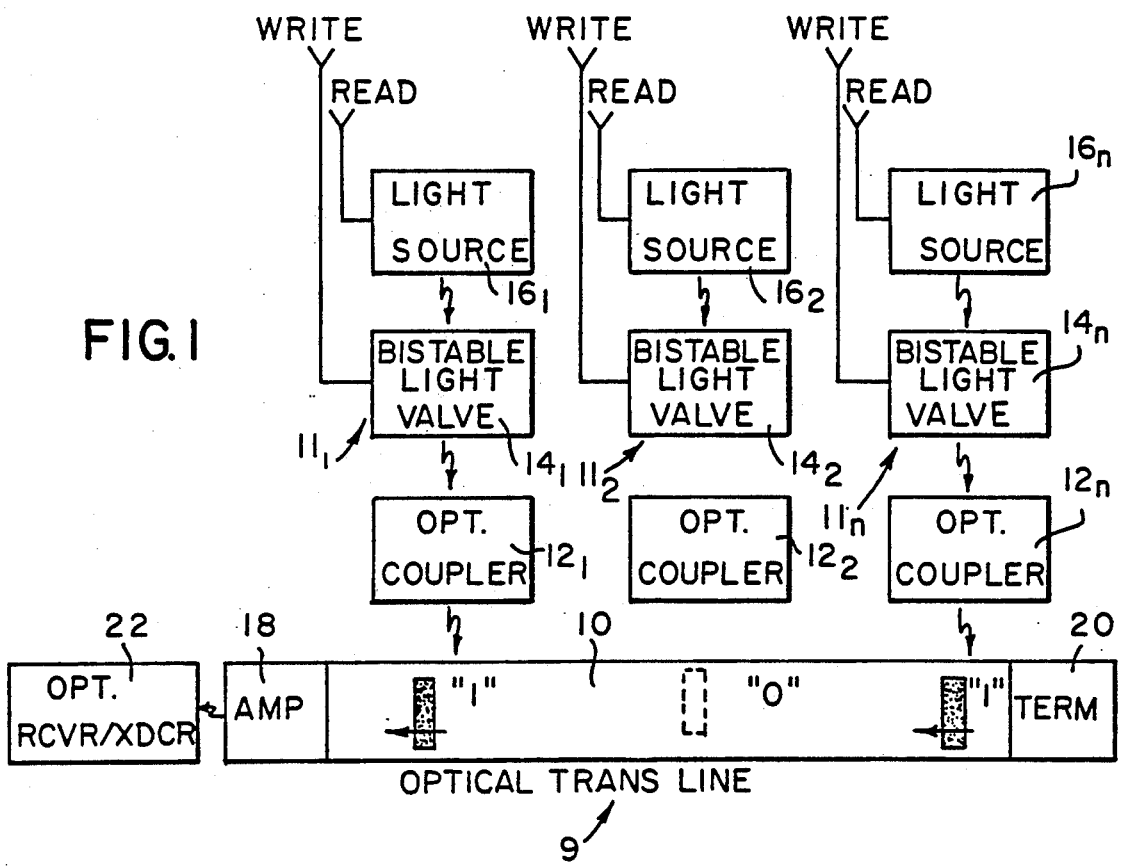
FIG. 1 is an electro-optical block diagram broadly illustrative of the inventive concept of this invention.

Referring now to the drawings wherein like reference numerals refer to like components throughout, reference is first made to FIG. 1. Shown thereat is a simplified block diagram depicting the inventive concept of the subject invention including, among other things, a binary signal transmission line assembly 9 including an optical fiber transmission line 10, the details of which are shown in FIG. 2, and which will be subsequently considered. The optical transmission line 10 is shown receiving optical energy from a plurality of light modules $11_1$, $11_2$ ... $11_n$ including respective optical fiber or liquid crystal optical coupler elements $12_1$, $12_2$, ... $12_n$ which are located adjacent a respective number of bistable optical light valves $14_1, 14_2, \ldots 14_n$. The light valves are electrically set in one of two stable binary states, i.e. light transmissive or light inhibiting, during a WRITE mode. Behind each of the light valves $14_1 \ldots 14_n$ is a respective source of illumination $16_1, 16_2, \ldots 16_n$ which is adapted to be energized during a READ mode.

Upon energization of the light sources $16_1, \ldots 16_n$, light energy will be coupled in the form of light pulses to the optical transmission line 10 depending upon the state of the bistable light valves $14_1 \ldots 14_n$ where a particular light valve, for example, valve $14_1$, is set to a transmissive state, a light pulse, i.e. a binary "1", will be transmitted to the optical fiber transmission line 10 via the coupler $12_1$. If on the other hand the light valve $14_2$ is set into a light blocking state, light energy from the source $16_2$ will be inhibited and no pulse will be coupled to the transmission line 10 via the optical coupler $12_2$ and being indicative of a binary "0" as shown.

Accordingly, a series of optical pulses or the absence thereof coupled to the optical fiber output transmission line 10 comprises a multibit digitally coded optical pulse train which is fed to one end thereof which may be coupled to an output light amplifier apparatus 18. At the opposite end of the optical transmission line fiber 10 is an optical absorbent type termination device 20 which will prevent any optical energy impinging thereon from being reflected back down the line 10 towards the amplifier 18. The output of the optical amplifier 18 is then coupled to a suitable optical receiver and transducer apparatus which is shown by reference numeral 22, where a digitally coded electrical signal is provided for use by apparatus, not shown and which forms no part of this invention.

Figure 3:
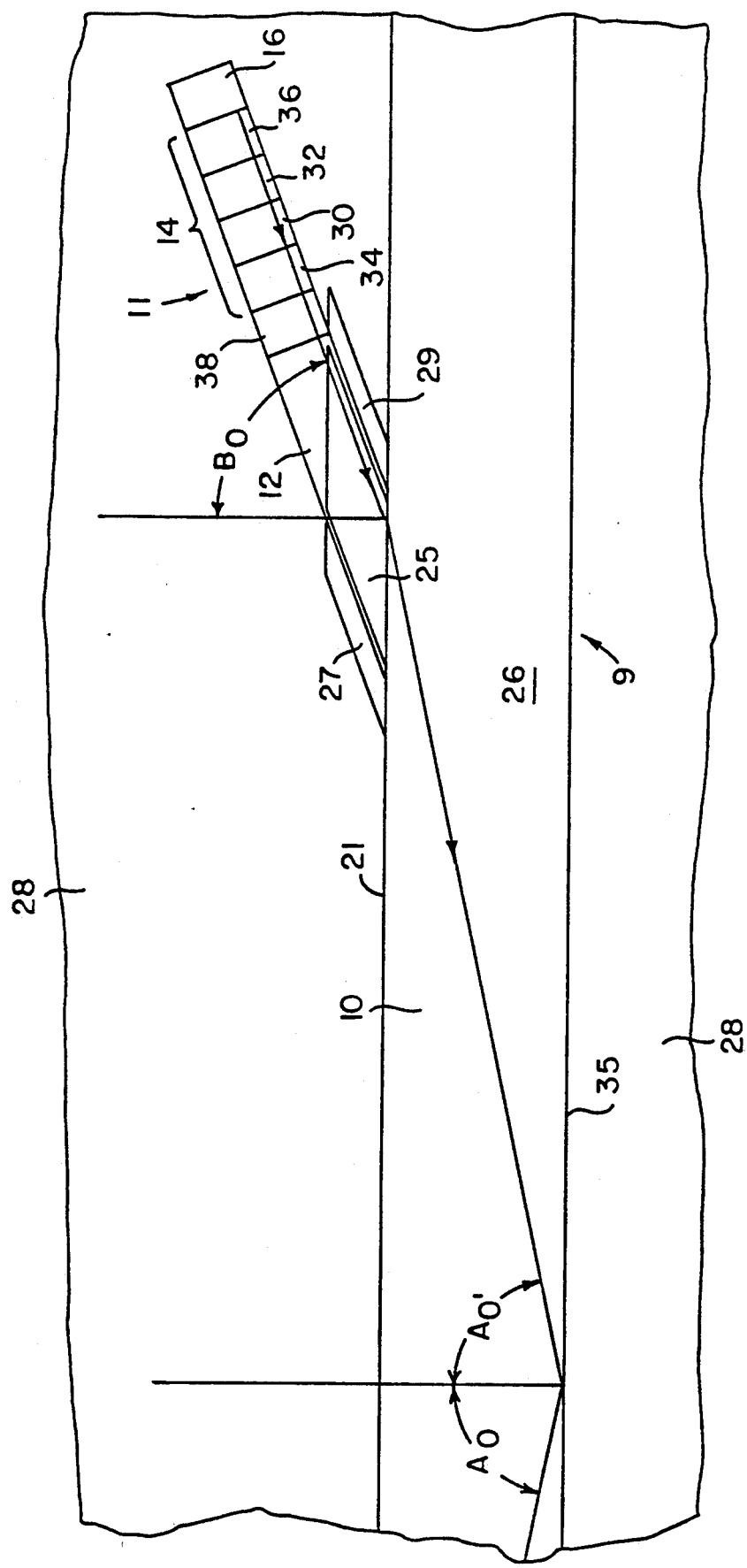
FIG. 3 is a side elevational view of FIG. 2.

Referring now to FIGS. 2 and 3, shown thereat is a section of the transmission line 10 of rectangular cross section and a light-injecting module 11, which is, typically, $2 \times 3$ $\mu$m in cross section and which terminates in an optical coupler element 12 that guides light from light valve 14 to a core 26 of rectangular cross section of the transmission line 10 which is also $2 \times 3$ $\mu$m in cross section. The rectangular shape of the cross section of the transmission line 10 helps maintain the direction of polarization of the light propagating therein.

As shown in FIG. 3, the light injecting module 11 is angulated at an angle B relative to a transverse axis of the transmission line core 26. As shown schematically in FIG. 1 and graphically in FIG. 8, other light-injecting modules, e.g. modules $11_2, 11_3, 11_4 \ldots 11_n$, are positioned parallel to module $11_1$ shown in FIG. 3. In addition to the core 26, the fiber 10 is also embedded in a cladding layer 28, typically 4 $\mu$m thick as further shown in FIGS. 7 and 8. The core 26 is selected to have an index of refraction $n_1$ which is larger than the index of refraction $n_2$ of the cladding 28.

It is to be noted that if light had propagated through the cladding material 28 to the core 26, it would not travel along the core 26 by a series of total reflections but instead would lose energy into the cladding 28 each time the light beam impinged on a core-cladding interface 35 such as shown in FIG. 3. This loss of energy is avoided by guiding the light into the core 26 through a material whose index of refraction, $n_p$, is greater than the index of refraction $n_2$ of the cladding material 28.

For the sake of illustration, an angle $A_1$ is defined as the angle between a transverse axis of the transmission line core 26 and a light ray in the core. $A_0$ is the critical angle, the smallest value of the general angle, $A_1$, for which total internal reflection occurs at a core-cladding interface 35. Similarly, $B_1$ is the angle between a transverse axis of the transmission line core 26 and a light ray approaching the core which is refracted to become $A_1$ in the core. $B_0$ is the particular angle of incidence for which the approaching ray will be refracted to the angle $A_0$ in the core. It is well known that:

$$\sin A_0 = n_2/n_1 \tag{1}$$

where $n_1$ is the index of refraction of the core material 26 and $n_2$ is the index of refraction of the cladding material 28.

By Snell's Law for any corresponding angles A and B:

$$\sin B/\sin A = n_1/n_2 \tag{2}$$

then, $$\sin B_0 = \sin A_0 \times (n_1/n_2) = n_2/n_1 \times n_1/n_2 = 1 \tag{3}$$

and $B_0 = 90°$. That is, if the incident ray had approached the core through the cladding, it could be totally reflected only if it were parallel to the axis of the transmission fiber. But in that case it never reaches the core-cladding interface 35. Thus, a ray that traverses the cladding 28 cannot be totally reflected.

To be totally reflected, light must approach the core 26 by going through some other material. If the material of the coupler 12, for example, has an index of refraction $n_p$ less than $n_2$, then $\sin B_0 > 1$ and $B_0$ is impossible. If the index of refraction of the coupler medium is greater than $n_2$, then $\sin B_0 < 1$ and, $$B_0 = \arcsin n_2/n_p. \tag{4}$$

In such a case, there is a range of angles of incidence A for which the light will be guided along the core 26 as shown in FIG. 3. Since $A_0$ is the critical angle of incidence for the interface between the core 26 and the cladding 28, light impinging on the interface 35 at that angle or at a greater angle but less than 90 degrees propagates along the fiber 10 in a series of total reflections.

If $n_1$ is significantly greater than $n_2$, the index of refraction $n_p$ of the coupler 12 may be chosen to have a value intermediate between $n_1$ and $n_2$, i.e.: $n_1 > n_p > n_2$. In that case, a light pulse injected from the coupler 12 into the core 26 of the optical transmission line 10 will propagate along the core 26 by a series of total internal reflections, because $n_p > n_2$ and will not be refracted into couplers it passes along the core because $n_1 > n_p$.

In some applications, $n_1 \approx n_2$ in order to provide a fairly flat trajectory for the light pulse and it may not be possible to select an index of refraction, $n_p$, for the optical coupler 12 which is sufficiently greater than $n_2$ and sufficiently smaller than $n_1$ for effective operation. In that case, the index of refraction of the optical coupler 12 can be controlled electrically as described below to provide the relationships $n_1 > n_{po}$ when a light pulse is propagating along the core 26 and $n_{pi} > n_2$ when a light pulse is being injected into the core 26. $n_{po}$ is the index of refraction of the coupler material when the coupler is not being used to inject light into the core and $n_{pi}$ is the index of refraction of the coupler material when the coupler is being used to inject light into the core.

Considering now the light modules $11_1 \ldots 11_n$ (FIG. 1) and more particularly the module 11 shown in FIG. 2, they include liquid crystal modules. Each module 11 includes a nematic liquid crystal optical coupler 12, a liquid crystal light valve 14, and a LED light source 16.

With respect to the liquid crystal optical coupler 12, it includes a body 19 of generally rectangular cross section filled with a liquid crystal material which is in contact with the top surface 21 of the rectangular core 26. The long dimension of the optical coupler 12 cross section as well as that of the core 26 are parallel and the light passing therethrough is polarized parallel to the long dimension. A first pair of electrodes 23 and 25 are applied to the side walls of the body 19 and a second pair of electrodes 27 and 29 are applied to the front and back walls as shown. The purpose of the electrodes 23, 25 and 27, 29 is to permit the application of an electric field thereacross to electrically polarize the molecules of the liquid crystal material and selectively control their orientation and thereby selectively control the index of refraction presented to the light propagating through the coupler.

It is well known that a typical characteristic of nematic liquid crystal compounds is the rod-like shape of their molecules. When they are in the liquid crystal phase, these molecules take up certain orientations relative to each other and to the liquid crystal surface. It is usual to describe this orientation in terms of a "director", which is a unit vector pointing along the time averaged preferred orientation of the molecules in a predetermined volume. In nematic ordering, the molecules are aligned parallel to each other but mutually apart. The molecules are free to move relative to each other so that a liquid phase property is exhibited. For a more detailed explanation, reference can be made to the textbook entitled, *Optoelectronics*, J. Wilson et al, Second Edition, Prentice-Hall International (U.K.) Ltd. 1989, pp. 144–148.

Figure 4:
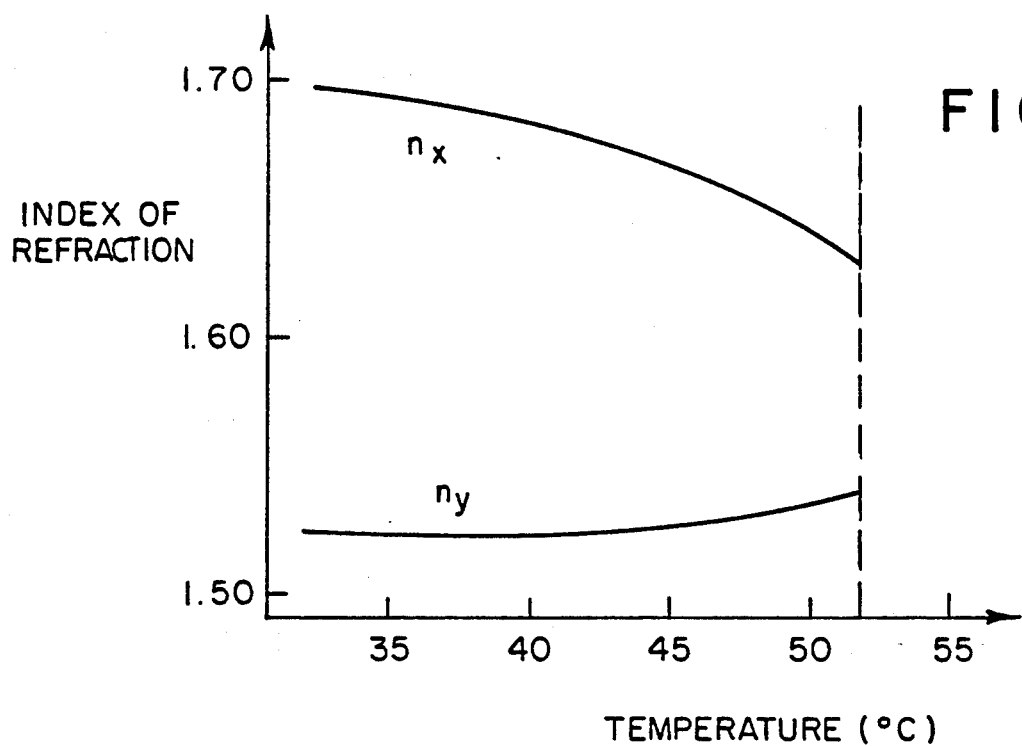
FIG. 4 depicts the indices of refraction for light polarized parallel and perpendicular to the director of a typical liquid crystal and illustrates how the indices vary with temperature.

It is also known that a nematic liquid crystal has a large difference in its index of refraction for polarized light depending upon whether the plane of polarization of the light is parallel or perpendicular to the director of the liquid crystal. This is shown, moreover, in the characteristic curves shown in FIG. 4 where the relationship of temperature vs. index of refraction is shown for polarization parallel and perpendicular to the polarized light as indicated by the curves $n_x$ and $n_y$, respectively.

Figure 5A:
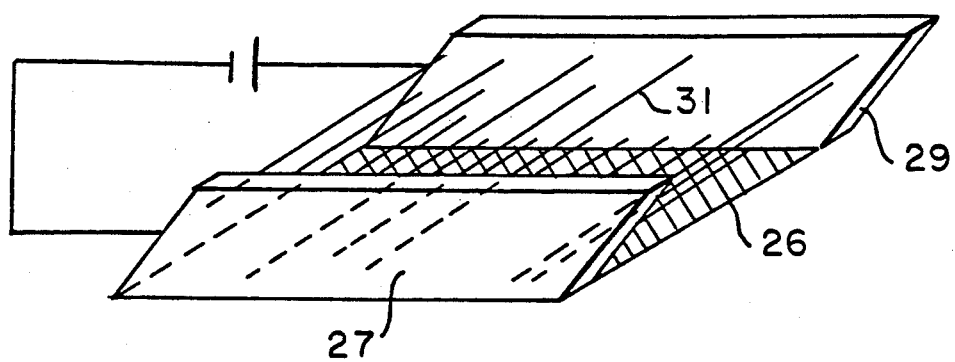
FIGS. 5A and 5B are illustrative diagrams helpful in understanding the operation of the optical coupler shown in FIG. 2.

Accordingly, depending upon which pair of electrodes 23, 25 or 27, 29 of the coupler 12 illustrated in FIG. 2 is energized, the index of refraction will change for polarized light incident thereto. For example, as shown in FIG. 5A when electrodes 27 and 29 are activated, the directors 31 of the electrically polarized liquid crystal material are perpendicular to the plane of the optical polarization of the light in the core 26 of the transmission fiber 10, presenting a low index of refraction to the light so that light traveling inside the core 26 does so by total internal reflection, while minimizing leakage of light back into the body 19 of the coupler element 12. On the other hand, when the electrodes 23 and 25 are activated as shown in FIG. 5B, the directors 31 of the electrically polarized liquid crystal are parallel to the plane of polarization of light in the core element 26 of FIG. 2, presenting a high index of refraction to the light, allowing light to be injected into the core 26 from the coupler 12 at an angle $A_1$ that allows total reflection.

Figure 5B:
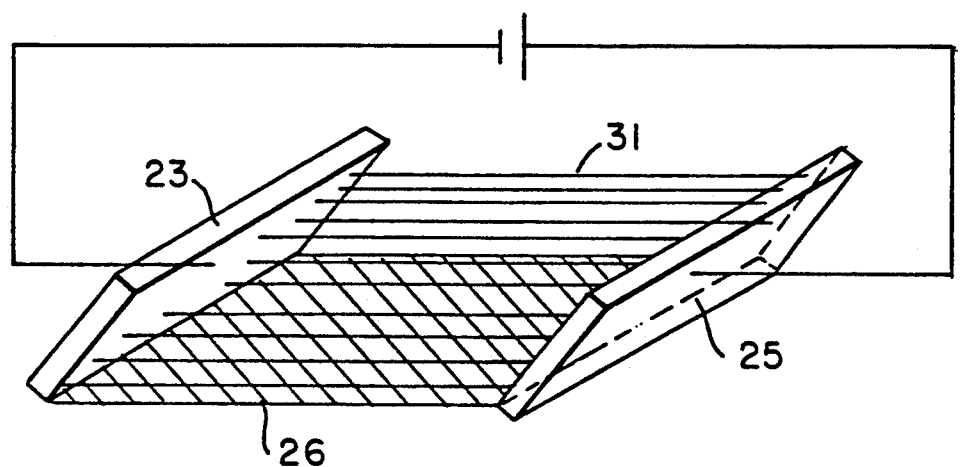

Thus, when a light pulse from the light valve 14 is to be coupled to the core 26, the electric field orienting the liquid crystal of the coupler 12 as shown in FIG. 5A is removed and a new field at right angles to the original one is generated as shown in FIG. 5B.

It should be noted, however, that a large difference in the index of refraction of a material depending on its orientation with respect to polarized light is not restricted to liquid crystals. The effect follows from interaction between the electric field of the light and charges in an electrically polarizable molecule. This phenomenon is discussed, for example, by N. H. Hartshorne, in the chapter entitled, "Optical Properties Of Liquid Crystals" in the text *Liquid Crystals and Plastic Crystals*, Volume 2 by Gray and Winsor, Halstead Press, 1974.

Considering now the details of the light valve 14, its major component comprises a surface stabilized ferroelectric liquid crystal (SSFLC) cell 30 having transparent electrodes 32 and 34 formed on either side thereof, and to which polarizer elements 36 and 38 are attached. The polarizer 36 is positioned adjacent a light source 16, while the polarizer 38 is contiguous to the liquid crystal coupler 12.

SSFLC crystal cell 30 makes use of a liquid crystal molecule, one axis of which has a permanent polarization. This type of device has been described in a publication entitled, *Liquid Crystals*, Peter J. Collings, Princeton University Press, 1990 at pages 115-117, as well as a publication entitled, "Room-temperature switching behavior of ferroelectric liquid crystals in thin cells", J. S. Patel, *Applied Physics Letters*, 15 Dec. 1985, Vol. 47, No. 12, pp. 1277-1279.

In such devices, molecules of liquid crystals that form in the smectic phase tend to arrange themselves in regularly spaced planes. The particular molecule typically used for a SSFLC cell forms a chiral smectic C phase. In the smectic C phase, the director makes an angle other than 90° with the planes. The directors of the particular molecule used for the SSFLC cell make an angle of 22.5° with the line perpendicular to the smectic planes. The molecules that form in a chiral smectic C phase have a twist in their rod-like structure so that, in bulk, the direction of the director changes in a regular progression from one layer to the next. However, in the SSFLC cell 30, the directors are surface-stabilized so that those near the surface of the cell are held more or less parallel to the surface and the cell is so thin that no director is far from a surface. The effect of the chiral tendency is to provide a crystal structure in which one axis is perpendicular to the long axis of the molecule. In the SSFLC cell 30, this perpendicular axis bears a permanent dipole moment, making the molecule ferroelectric.

Figure 6A:
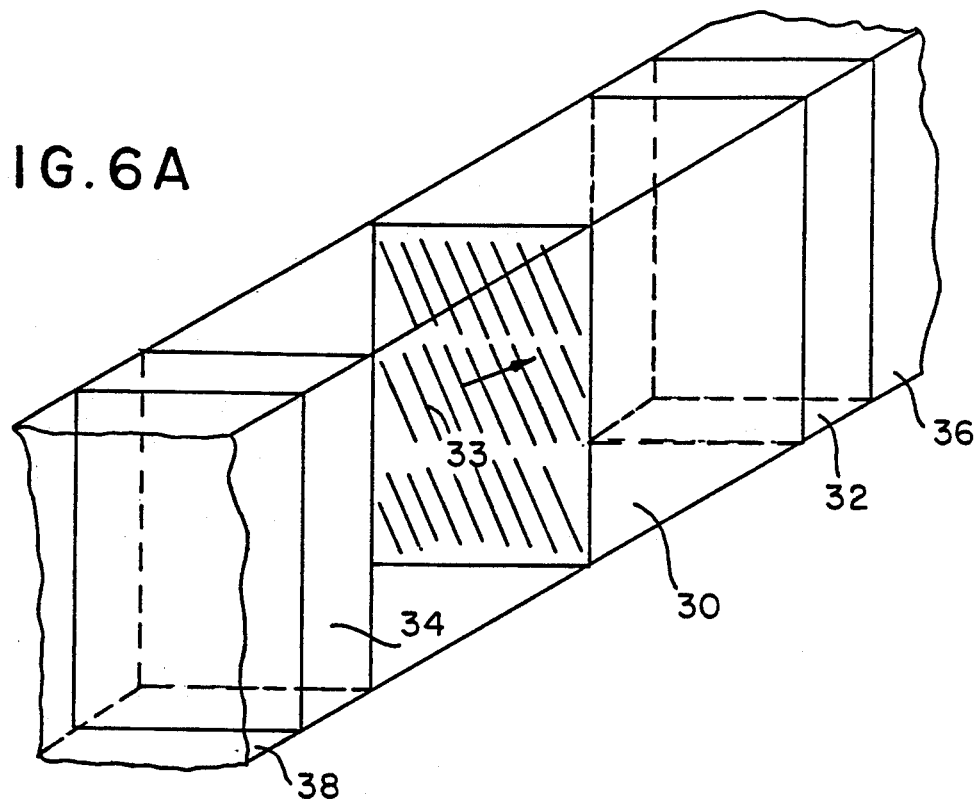
FIGS. 6A and 6B are illustrative of the liquid crystal light valve shown in FIG. 2.

The electrodes 32 and 34, on either side of the SSFLC cell 30, comprise transparent electrode coatings, and operate to generate an electric field which acts on the permanent dipole moment to hold all of the molecules of the SSFLC cell 30 in the same orientation. The polarizers 36 and 38 are oriented parallel to each other so that they only pass polarized light which is parallel to the directors 33 as shown in FIG. 6A.

Figure 6B:
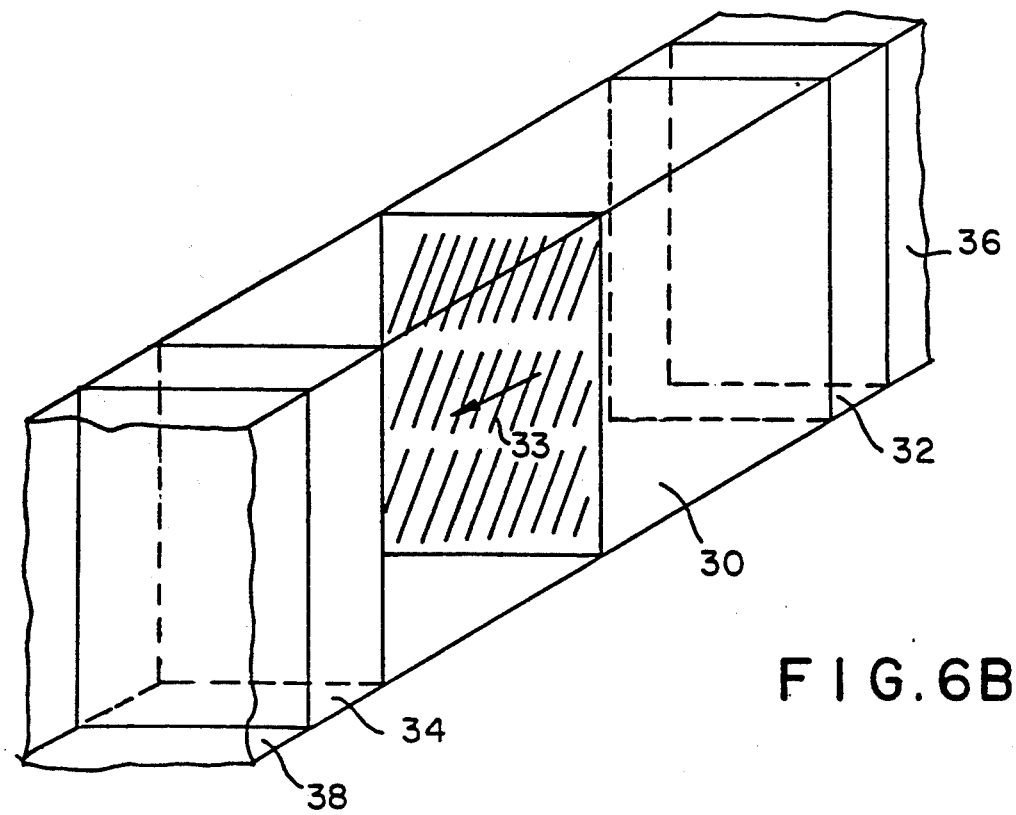

When the field is reversed as shown in FIG. 6B, the directors' orientation in the cell 30 is changed to one making an angle of 45° with their former direction but still parallel to the surface to which they are stabilized. The light coupled to the cell 30 by the first polarizer 36 is still parallel to the previous direction of the directors 33 and can be considered as comprised of components parallel to and perpendicular to the new direction of the directors. These components will have different indices of refraction so that their relative phases will shift, causing a rotation of the plane of polarization when they emerge from the cell and recombine. The thickness of the cell 30 is set so that the light emerging from it has rotated by 90° and will not pass the second polarizer 38.

Figure 9:
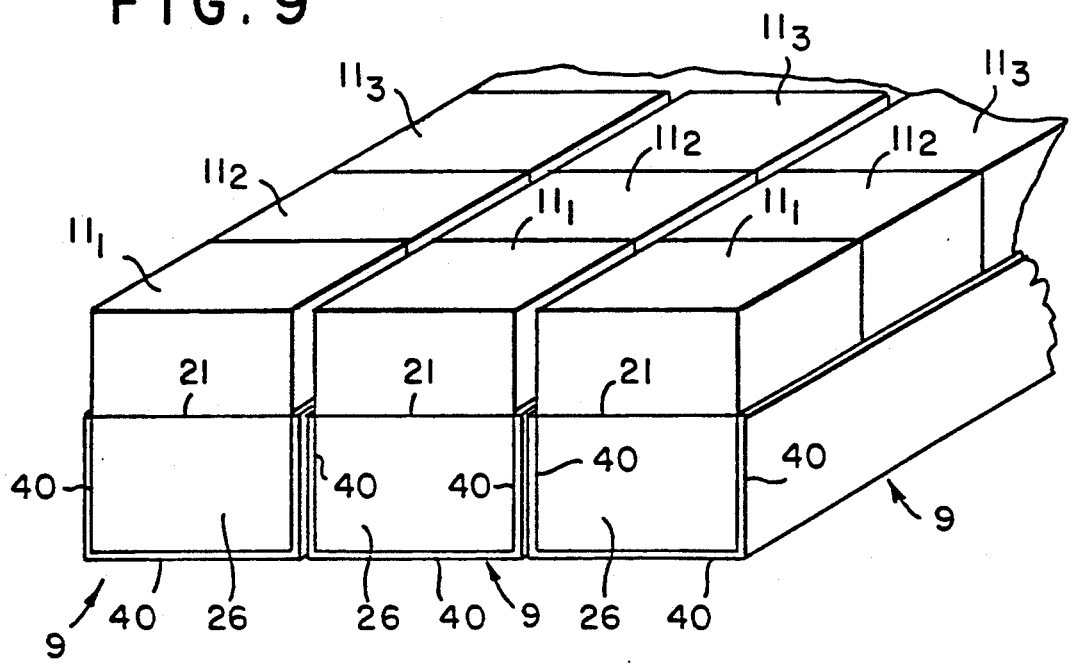
FIG. 9 is a perspective view partially illustrative of another embodiment of the invention utilizing the elements shown in FIGS. 7 and 8.
Figure 8:
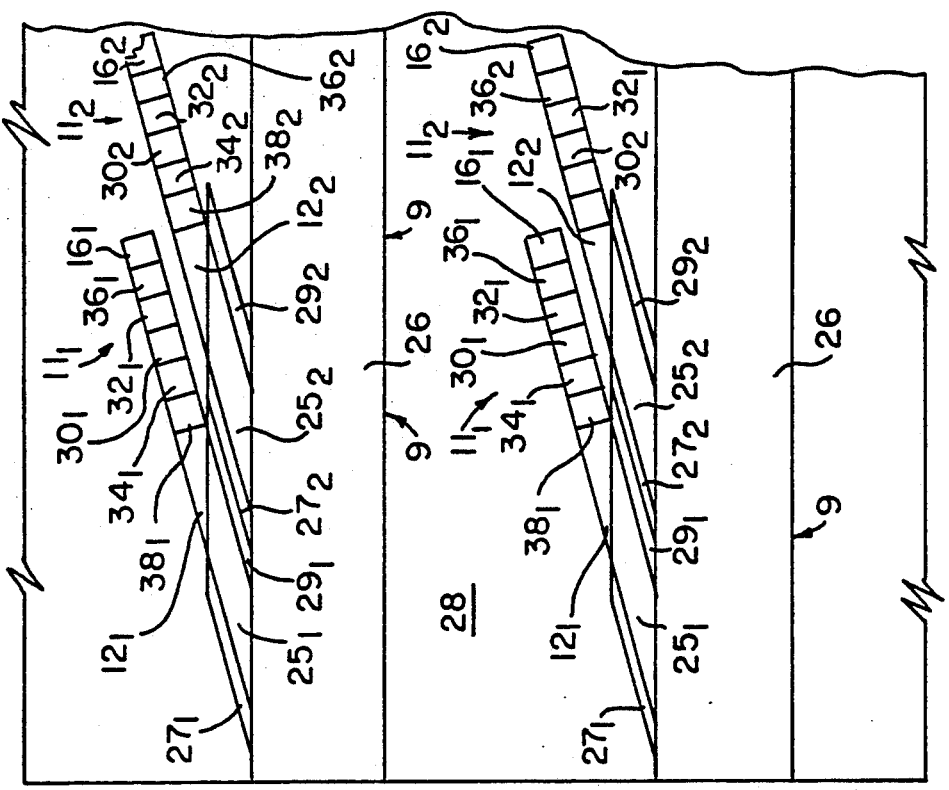
FIG. 8 is a side elevational view of the array shown in FIG. 7.
Figure 7:
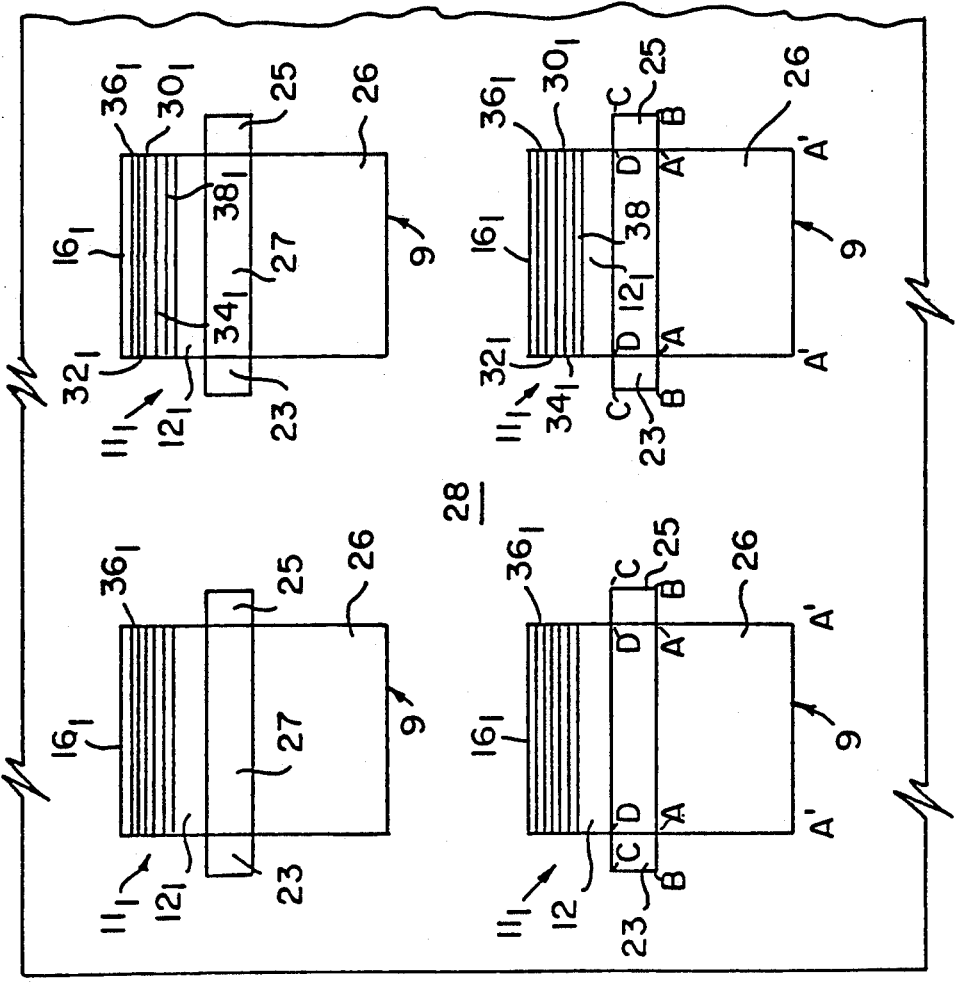
FIG. 7 is a front plan view of an array of elements shown in FIG. 2.
Figure 20:
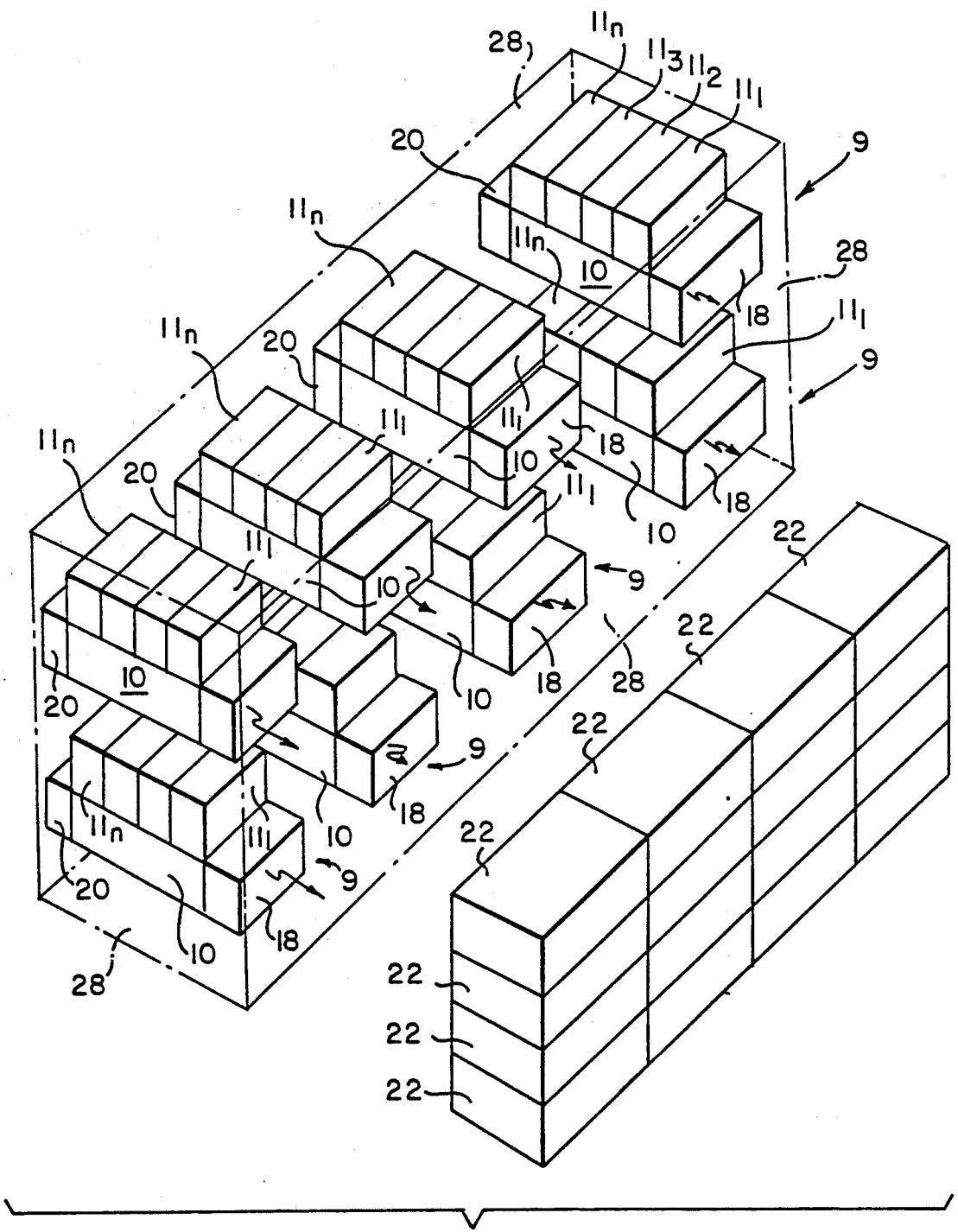
FIG. 20 is a perspective view of a memory array in accordance with the invention.

Referring now to FIGS. 7, 8 and 9, the liquid crystal components shown in FIG. 2 are intended to be included in a high density package for use in a system as shown in FIG. 20 where a matrix of optical binary signal transmission lines 9 are integrated and surrounded by a volume of cladding 28. Each transmission line 9 includes a respective fiber optic transmission element 10 and a plurality of light injecting modules $11_1 \ldots 11_n$ coupled thereto which operate in conjunction with their respective couplers $12_1 \ldots 12_n$ to inject light pulses into the respective cores 26, depending upon the state of the SSFLC light valve cell 30 associated therewith.

An entire memory system can be formed from the configuration shown in FIG. 2 by horizontal layers laid down one at a time and formed into a solid unit by applying pressure. Experience has shown that separate layers of many transparent polymers which would be suitable for cladding material 28 can be made to coalesce under pressure into a block that appears as stiff and as transparent as if it had been made as a unit. This fact and some adaptation of the methods of photolithography can be used to fabricate a memory system embodying the concepts as shown in FIGS. 7, 8 and 9 with a density of data comparing favorably with current memory chips.

Before describing a method for constructing one light injecting module 11 such as shown in FIG. 2, it should be understood that each operation occurs simultaneously at the site of every module on a particular layer so that when the described operations are completed, there is a layer of many cores 26 side by side, each coupled to a plurality of modules $11_1 \ldots 11_n$, all embedded in cladding material 28. Identical operations are repeated for successive layers of elements. As many layers are compressed, the system becomes self-supporting.

In order to fabricate the structure as shown in FIGS. 7 and 8, a layer of cladding material 28 of a thickness up to the level of A'—A' (FIG. 7), is laid down on a horizontal support, such as a substrate, not shown. A shielding layer of width A'—A' is laid down over the cladding material 28 over the future site of each core 26 in the bottom layer. Another layer of cladding material 28 is laid over the first layer to the height or thickness corresponding to B-A-A-B. Next a trough with a cross section of A'-A-A-A' is cut into the cladding layer 28 by any one of suitable known methods such as a high intensity laser. The bottom of the rectangular trough is cut down to the level A'—A', since the shielding layer applied thereat stops the cutting agent. Each trough thus formed is next filled with a core 26. This can be accomplished by filling the trough and polymerizing the filling or by setting a preformed core into the trough. Another shielding layer is next applied to the top of each core 26 and extended to the width B-A-A-B. A third layer of cladding 28 is then laid down, bringing the level up to the height of C-D-D-C as shown in FIG. 7 and pressure is applied to bond the whole structure. Next, two parallel side troughs are cut into the third layer of cladding 28, thereby defining the cross sections of A-B-C-D for the full length of the core 26.

A layer of cladding material 28 as thin as practicable is laid down over the full extent of the system, spanning the core and the two troughs. A pattern of alternating conducting and non-conducting areas is laid down above the troughs A-B-C-D; the conducting areas having the shapes of the side electrodes 23 and 25 shown in FIG. 2, with the non-conducting intervals being the spaces therebetween and consisting of untreated cladding material 28. A strip of conducting material is laid down for each electrode 23 and 25 and is continued over the outer trough wall as an electrical lead. The layer at each line D at the edge of the central mesa is cut through along the length of the core 26, removing the inner support for the span. The layer at the outer edge of the trough along the line C is then weakened along the length of the core 26 to provide a hinge. Air pressure is then used to force the pattern bearing shelf down so that it is vertical and in contact with the outer wall of the trough, thus forming electrodes 23 and 25. Next the troughs are filled with cladding material 28 and pressure is applied to bond the structure, forcing the electrodes 23 and 25 into permanent position on the wall of the trough near the surfaces D-A.

Next a cylindrical hole of rectangular cross-section is cut in the cladding 28 between the contacts 23 and 25 until it makes contact with the upper surface 21 (FIG. 2) of the core 26 and between the sites for the electrodes 27 and 29 which are now to be fabricated. The base of the hole covers the area common to the core 26 and the light injecting module 11 whose central longitudinal axis as shown in FIG. 7 makes an angle with respect to the perpendicular to the upper surface 21 and which comprises the angle B (FIG. 3).

A process similar to the one used to place the electrodes 23 and 25, is then used to deposit the conducting material for electrodes 27 and 29 on a thin layer of cladding spanning an open space, cutting away the supports of the layer except for a weakened hinge, and then applying air pressure to set the electrodes 27 and 29 in place and using hydrostatic pressure to fix them permanently into position.

The elements of the light injecting module $11_1 \ldots 11_n$ are implemented by a sequence of similar procedures. The liquid crystal material is injected by a syringe at a temperature for which it is liquid, cooled to the temperature of the transition to the liquid crystal phase, and temperature controlled to stay in that particular phase.

It should be noted that the density of data can be increased by reducing the thickness of the cladding 28. However, this would result in greater loss of light and possibly a higher noise level. This can be overcome by coating the outside surfaces of the core elements 26 as shown in FIG. 9 with a thin layer 40 of conducting material so that specular reflection occurs when light traveling down the respective cores 26 impinges on the inside of the core walls. Such a layer 40 of conducting material would be relatively thinner than the cladding 28 contemplated with respect to the arrangement shown in FIGS. 7 and 8 so that the density of the elements and therefore the density of the data can be greatly increased.

The role of the cladding 28 in providing structural strength and positional stability as shown in FIGS. 7 and 8 can be filled by any number of polymerizable liquids since optical properties would be immaterial. Many trade-offs are possible in the construction of such a memory system as shown in FIGS. 7 and 8. Therefore, the values of the various parameters of the system nevertheless must be adjusted for optimum performance for each application.

Representative dimensions resulting from a typical physical implementation of the embodiment shown in FIGS. 7 and 8 are tabulated below:

Core 26: 2 μm×3 μm, $n_1 = 1.530$
Cladding 28: 4 μm thick, $n_2 = 1.525$
Liquid Crystal 12: $n_{po} = 1.525$ when used as cladding $n_{pi} = 1.695$ when used as guide
Angle $B_1 = 76.4°$
Distance between bits along the transmission fiber = 3 μm
Read rate $(3 \times 10^8$ m/s$)/1.530 \div (3 \times 10^{-6}$ m/bit$) = 6.5 \times 10^{13}$ bits/s
Volume occupied by one bit $= 1.3 \times 10^{-16}$ m³/bit
Density of data $= 7.9 \times 10^{15}$ bits/m³

Figure 10:
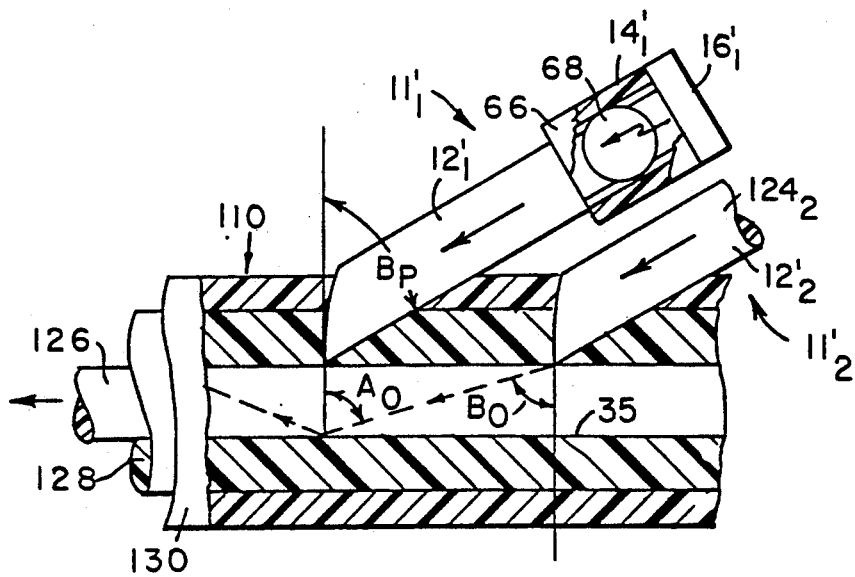
FIG. 10 is a partial central longitudinal cross section illustrative of another embodiment of the optical coupler and optical transmission line shown in FIG. 1.

Referring now to FIG. 10, which is directed to another embodiment of the invention, shown thereat is a longitudinal cross section and two optical couplers $12'_1$ and $12'_2$ of light modules $11_1'$ and $11_2'$. The couplers are comprised of short lengths of uncladded optical fiber cores $124_1$ and $124_2$ typically 4 μm in diameter, that guide light from the light valves e.g. light valve $14_1'$ to a core 126 of circular cross section of a transmission fiber 110 which is also 4 μm in diameter. This configuration is also shown in the perspective view of FIG. 11.

Figure 11:
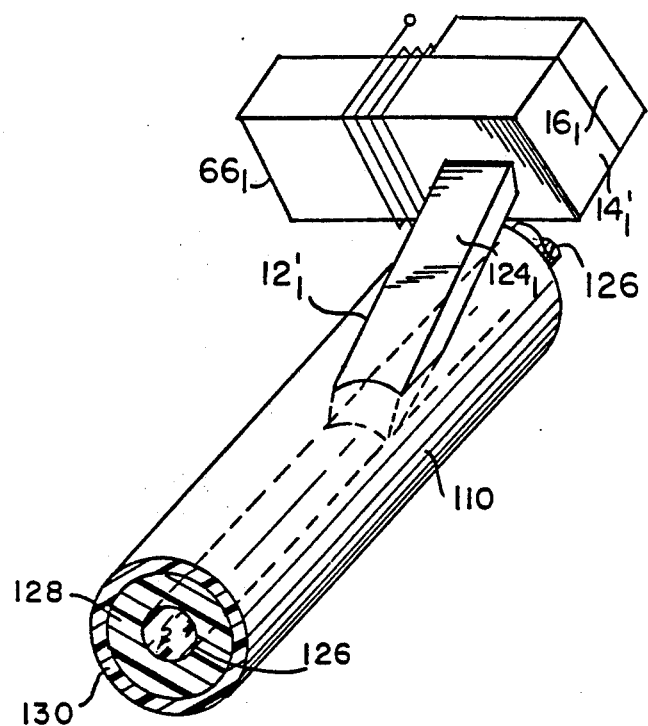
FIGS. 11 and 12 are partial perspective views of variations of other embodiments of the optical coupler and light valve for the embodiment shown in FIG. 10.
Figure 12:
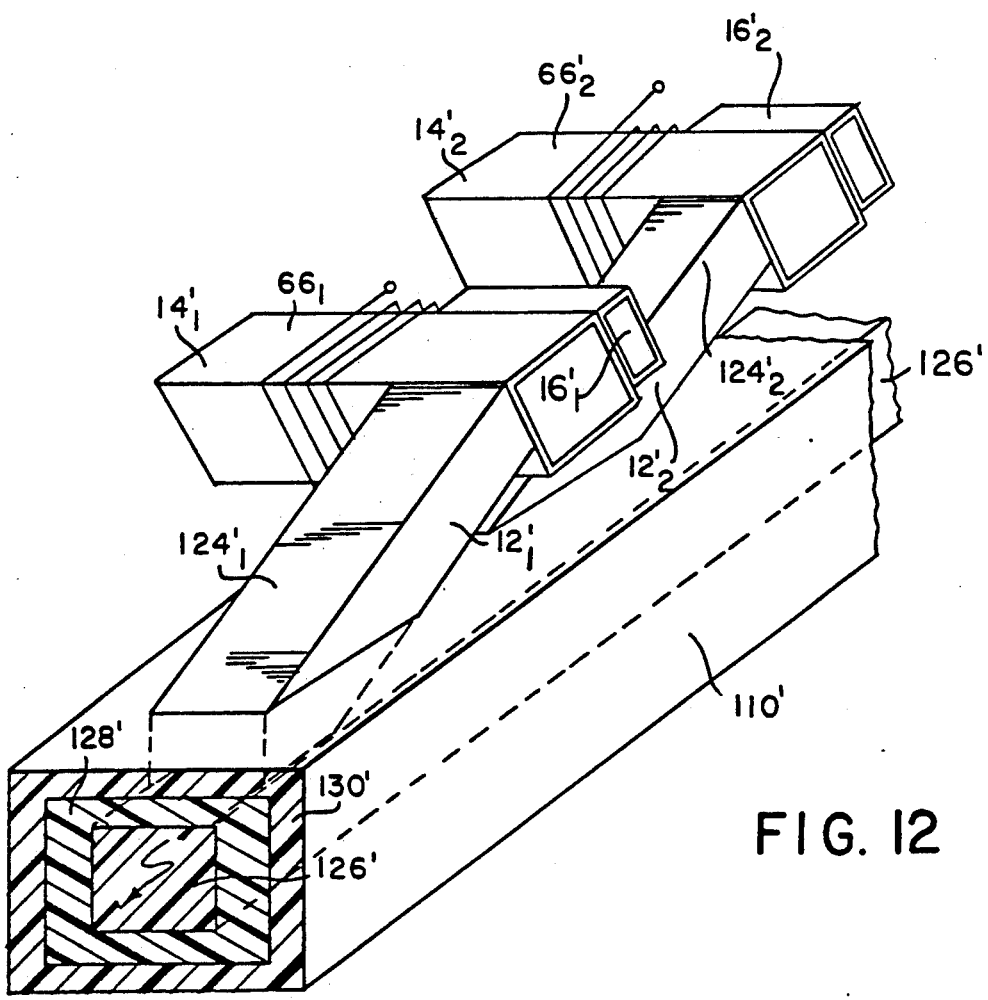

In addition to the core 126, the fiber 110 also includes a cladding layer 128 which is of a relatively smaller thickness, typically 3 μm, relative to the diameter of the core 126. Also, there is an outer polymeric coating 130 having yet a smaller thickness, typically 2 μm, outside of the cladding layer 128. The core 126 is selected to have an index of refraction $n_1$ which is larger than the index of refraction $n_2$ of the cladding layer 128. The index of refraction $n_3$ of the outer layer 130, on the other hand, is much greater than that of the core 126, i.e. $n_1 > n_2 < < n_3$. Also, the index of refraction $n_p$ of the liquid crystal couplers $112_1$ or $112_2$ on the guide fiber cores $124_1$, $124_2$ is greater than $n_2$ and less than $n_1$, i.e. $n_1 > n_p > n_2$. The cross section of the transmission line fiber 110 as shown in FIGS. 10 and 11 need not be circular. A rectangular cross sectional configuration as shown in FIG. 12 can also be utilized. There the core 126', cladding 128', and outer coating 130' of the transmission line 110' are generally rectangular in cross section.

Further as shown in FIG. 10, the guide fiber cores $124_1$ and $124_2$ are situated parallel and angulated at an angle B relative to a transverse axis of the transmission line core 126. The respective inner ends of the guide fibers $112_1$, $112_2$ are tapered in the direction of their longitudinal axes so as to shorten the length of an optical pulse injected into the core 126 of the transmission line element 110. Thus a plurality of guide fiber members $12'_1 \ldots 12'_n$ including uncladded core elements $124_1$, $124_2$, can as a group couple a sequence of light pulses into the transmission fiber 110 simultaneously or as nearly simultaneously as desired.

In traversing the optical coupler elements $12'_1, \ldots 12'_n$ and entering the core 126, there may be some losses that will require the necessity of amplification means such as at the output end of the line 10 as shown in FIG. 1 by reference numeral 18. Due to the size constraint, the amplifier means 18 coupled to the output end of the transmission line 10 as shown in FIG. 1 must of necessity be of comparable size. A semiconductor laser amplifier (FIG. 13) is a well known device and is suitable for such amplification.

Figure 13:
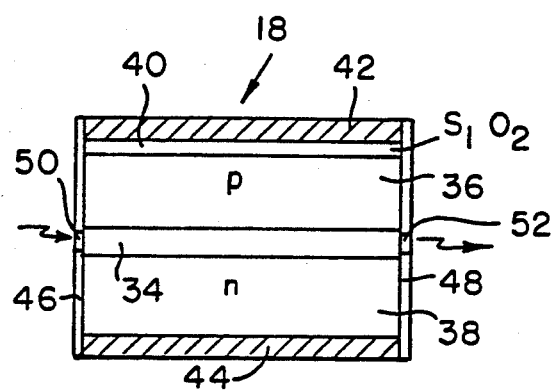
FIG. 13 is a central vertical cross section typically illustrative of a semiconductor laser amplifier which can be utilized with the system shown in FIG. 1.

As shown in FIG. 13, a typical laser amplifier device 18 comprises a planar structure fabricated, for example, from gallium arsenide (GaAs) and including an active region 34, upper and lower confinement regions 36 and 38, a current blocking layer of dielectric material 40, a pair of outermost metallic contacts 42 and 44, and antireflective coatings 46 and 48 which are applied to the end faces so that photons traverse the active region 34 only once when applied to an input aperture 50 and coupled out of the device via an output aperture 52. Such a device is extremely fast in its operation and if greater amplification is required, several of the devices 18 can be cascaded.

This and other types of semiconductor lasers used in connection with this type of technology are shown and described in Chapter 13 entitled, "Semiconductor Lasers For Telecommunications", appearing in the text entitled *Optical Fiber Telecommunications II*, S. E. Miller et al, Academic Press Inc., 1988, at pp. 509-568.

Figure 14:
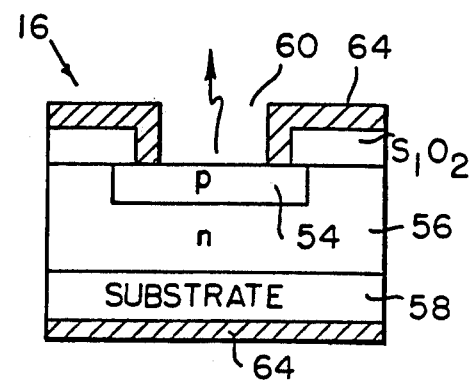
FIG. 14 is a central vertical cross section typically illustrative of a semiconductor light emitting diode which can be utilized with the system shown in FIG. 1.

In the present invention, information is stored digitally in the plurality of light valves $14_1 \ldots 14_n$. As noted above, each valve $14_1 \ldots 14_n$ has two stable binary states. One state allows light from the respective source $16_1 \ldots 16_n$ to be guided to the transmission fiber 10. The other state prevents the light from reaching the respective guide fibers $24_1 \ldots 24_n$ and the transmission line core 26. Each of the light sources $16_1 \ldots 16_n$ comprises, for example, a light emitting diode (LED). Such a structure can be implemented as shown in FIG. 14. There two p and n type semiconductor regions 54 and 56 of GaAs are fabricated on a substrate 58. A dielectric layer of $S_iO_2$ overlays the n region 56 and includes an opening 60 for the emission of light when the device is activated by coupling suitable electrical voltages across outer metallic contact layers 62 and 64.

This and other types of LED's are shown and described in the Chapter 12, "Light-Emitting Diodes for Telecommunications," pp. 467-507 of the above referenced text *Optical Fiber Telecommunications II*.

Many different kinds of other structures can be used as light valves $14_1 \ldots 14_n$. For example, in the configuration shown in FIGS. 15-18, light valve 14' comprises an electro-mechanical device including a relatively small body in the form of a housing 66 containing a reciprocating shuttle element 68 which blocks a pair of aligned holes 70 and 72 and permitting light to travel from an LED source through the valve body 66 when it is at one end of its travel and which clears the holes when it is at the other end of its travel. The valve body 66 comprises a moulded housing member having a flat or curvilinear outer surface 74 and includes a circular inner bore 76 and a pair of inwardly raised annular ridges 78 and 80 at either end which operate to pinch and hold the shuttle 68 at either end of the valve body 66.

The shuttle 68 is a short length of opaque polymer fiber including a core 82 and at least a cladding layer 84 containing particles of permanent magnet which have been aligned during polymerization. The fiber of which the shuttle is made is formed by a process similar to that by which polymer optical fiber is formed. For example, a number of such fibers are bonded together to form a composite cylinder which is then sliced by a microtome into suitable lengths. The bonding material is then removed by a solvent which also affects the core 82 and, to a lesser extent, the cladding 84. The result is a shuttle member 68 whose ends are slightly tapered inwardly and with hollows in their cores at both ends as shown in FIG. 17.

Figure 15:
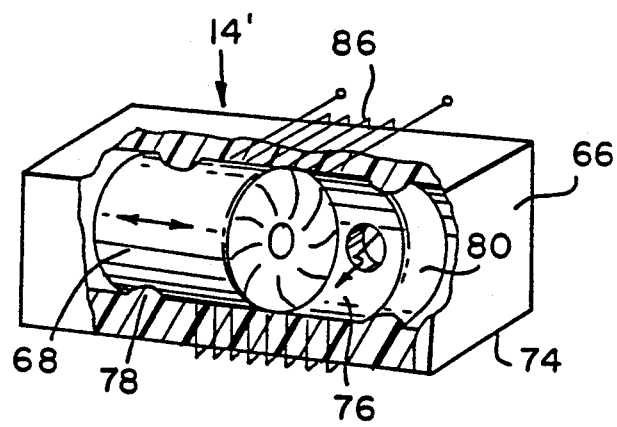
FIG. 15 is a perspective view, partially broken away, of an electro-mechanical light valve utilized with the embodiment shown in FIG. 10.
Figure 18:
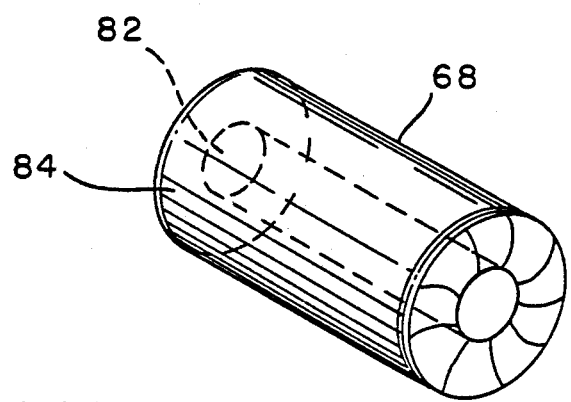
FIG. 18 is a perspective view of the shuttle element utilized in the device shown in FIG. 15.
Figure 19:
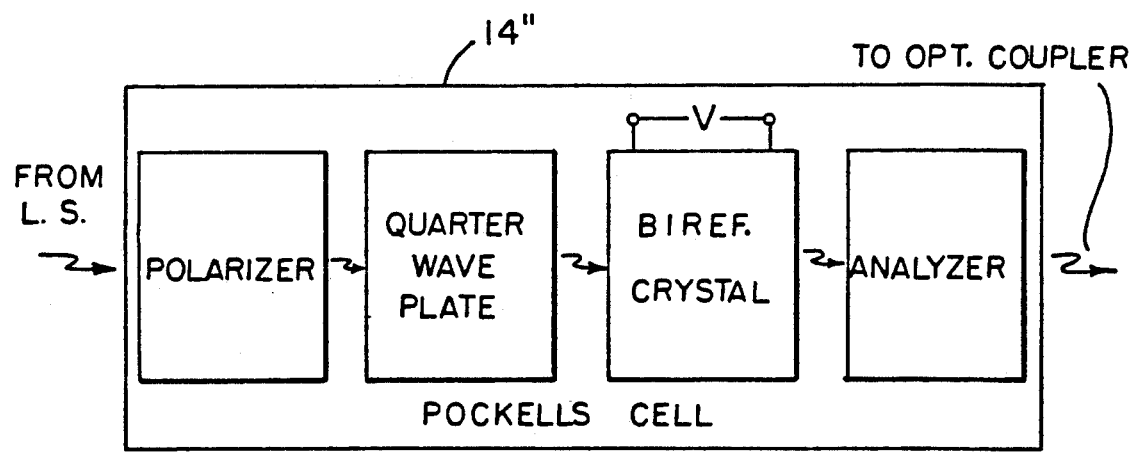
FIG. 19 is an electrical block diagram illustrative of a Pockel's cell type of light valve which can be used with the subject invention.

An electrical coil 86 is wound around the central portion of the valve body 66. The shuttle 68 is reciprocally moved back and forth by a pulse of current creating an axial magnetic field in a predetermined direction through the bore 76. The momentum jams the compliant end of the shuttle 68 into one of the raised ridges 78 or 80 at the end of the bore 76, holding it there firmly as shown in FIG. 16 until subsequently dislodged by a pulse of current in the other direction (FIG. 15). If speed is not of a major concern, a pneumatic embodiment can be employed.

Information stored in the valves $14_1 \ldots 14_n$ (FIG. 1) is permanent until deliberately changed but can be changed frequently and rapidly. An example is in iterative calculation where the results of one set of calculations become the data for the next. Where still greater speed is needed for such applications, it can be provided by using a polarized light device which requires a continuous voltage to keep it in one of its bistable states. Examples of such valves are the well known Pockel's and Kerr cells. In such applications it does not matter that the information is lost when the voltage is shut off. A Pockel's cell 14" is schematically shown in the block diagram of FIG. 18 and includes the well known components of a polarizer element 88, a quarter wave plate, a voltage controlled birefringent crystal 92, and an analyzer 94. Furthermore, the voltage controlled birefringent crystal can be replaced, when desirable, with a polarization rotating ferroelectric liquid crystal.

In a typical application, a particular amount of binary information is stored by setting each of a consecutive group of light valves $14_1 \ldots 14_n$ to a predetermined open or closed binary state and noting in an allocation table the name and location of that piece of information. When that information is called for, the corresponding light sources, e.g. LED's $16_1 \ldots 16_n$ are flashed, generating a sequence of light pulses or absences of light pulses in the transmission fiber 10, thus optically coding the desired information. The pulse sequence travels along the fiber at the speed of light in the fiber material. When the sequence reaches the exit end of the fiber including the amplifier means 18 as shown in FIG. 1, it can be used directly in an optical computer or it can be converted to electrical pulses by complementary receiver and transducer means 22 (FIG. 20) which might include photodiode means, not shown. After conversion, the information can be used like the data from any conventional memory device. A slower data rate can be presented to the transducer by flashing the lights in sequence instead of simultaneously and by providing a time delay between flashes.

An example of an information storage array is broadly illustrated in FIG. 20 where, as noted earlier, each reference numeral 9 represents a set of transmission line elements 10, 18 and 20 of FIG. 1, while each reference numeral $11_1 \ldots 11_n$ represents a light module including the elements 12, 14 and 16, for example, as shown in FIGS. 7 and 8. An x-y array of individual units or assemblies 22, each comprising respective receiver/transducer apparatus, is positioned in front of the sets of transmission line elements 9 to receive selective IR signals radiated therefrom. Each unit/assembly 22, when activated, generates respective utilization signals for performing a predetermined function from the information generated by the light modules $11_1 \ldots 11_n$ and coupled to the light transmission line elements.

FIG. 20 illustrates an advantage of having the output in the form of invisible light. The receiving element of any assembly 22 can be activated to receive information from the output element of any transmission line 9 at the speed of light in air without using couplers, switches, bus bars, or other hardware and without any mechanical motion. The assemblies 22 need not be in a regular x-y array; the receiving element of each unit 22 can be located conveniently close to the circuit that is to make use of the information.

Having thus shown and described what is at present considered to be the preferred embodiments of the subject invention, it is to be understood that the same has been made by way of illustration and not limitation. Accordingly, all alterations, modifications and changes coming within the spirit and scope of the invention are herein meant to be included.

I claim:

1. A digital memory system including optical fiber elements, comprising:
    a plurality of light energy sources being selectively energized during a read interval;
    a respective plurality of bistable light valves being programmed in a write interval to enable or inhibit the passage of light energy from said light energy sources;
    an optical fiber transmission line;
    said plurality of light energy sources being energized in a pulsed mode of operation to generate respective optical pulses which are enabled or inhibited from being coupled to said optical fiber transmission line by said light valves when digitally programmed during said write interval,
    said optical fiber transmission line further comprising a cladded optical fiber transmission line including a light propagating inner core and at least one outer layer of cladding surrounding said core; and
    a respective plurality of optical coupling means for angularly coupling optical pulses from said plurality of light valves to said core of said optical fiber transmission line for propagating optical pulses in a predetermined direction,
    the presence of an optical pulse propagating in said optical fiber transmission line signifying a first binary value and an absence of said pulse signifying a second binary value.

2. The digital memory system of claim 1 wherein the index of refraction of the core of said optical fiber transmission line is greater than the index of refraction of said outer layer of cladding.

3. The digital memory system of claim 1 wherein the index of refraction of said optical coupling means is greater than the index of refraction of the cladding of said cladded optical fiber transmission line and less than the index of refraction of the core of said cladded optic fiber transmission line.

4. The digital memory system of claim 1 wherein each of said bistable light valves comprise a liquid crystal cell assembly.

5. The digital memory system of claim 4 wherein said liquid crystal cell assembly includes an electrically polarizable liquid crystal cell.

6. The digital memory system of claim 5 wherein said liquid crystal cell assembly additionally includes electrode means on said electrically polarizable liquid crystal cell for selectively changing a polarization characteristic of said cell.

7. The digital memory system of claim 6 wherein said liquid crystal cell assembly additionally includes light polarizer means on opposite sides of said cell.

8. The digital memory system of claim 7 wherein said electrode means comprise transparent electrode means located intermediate said polarizer means and said cell.

9. The digital memory system of claim 8 wherein said electrode means comprise a pair of transparent electrodes located on said opposite sides of said cell.

10. The digital memory system of claim 8 wherein said liquid crystal cell comprises a surface stabilized ferroelectric liquid crystal cell.

11. The digital memory system of claim 1 and wherein said optical coupling means comprises a liquid crystal optical coupler.

12. The digital memory system of claim 11, wherein said liquid crystal optical coupler comprises an electrically controlled liquid crystal cell having first and second pairs of electrodes respectively formed on first and second pairs of opposing surfaces thereof for selectively changing the index of refraction of light passing through the cell.

13. The digital memory system of claim 1 and additionally including reflective coating means on selective portions of said core for causing internal specular reflection of said optical pulses propagating in said core while reducing light loss therefrom.

14. The digital memory system of claim 13 wherein said reflective coating is applied to selected outside surfaces of said light conducting core.

15. The digital memory system of claim 1 wherein said optical coupling means comprises a light propagating optical fiber core.

16. The digital memory system of claim 1 wherein each of said bistable light valves comprises an electrically driven optical shutter type device.

17. The digital memory system of claim 1 wherein each of said bistable light valves comprise a housing having a light conducting passage therethrough and an internal electro-magnetically driven reciprocatory member inhibiting light through said passage in a first stable state while enabling the passage of light therethrough in a second stable state.

18. The digital memory system of claim 17 wherein said light conducting passage comprises a transverse passage, said reciprocatory member comprises a shuttle formed from a length of magnetically treated optical fiber located in an axial bore of said housing, and additionally including means for generating a bidirectional axial magnetic field within said bore for driving said shuttle between said first and second stable states.

19. The digital memory system of claim 1 wherein each of said bistable light valves comprises a Kerr cell or a Pockel's cell.

20. The digital memory system of claim 1 wherein said optical fiber transmission line includes light energy amplification means for amplifying optical pulses received from said optical coupling means.

21. The digital memory system of claim 1 wherein said optical fiber transmission line includes optical termination means at one end for absorbing light energy impinging thereon for preventing undesired reflection of optical pulses from said one end.

22. The digital memory system of claim 1 wherein said optical transmission line means comprises a plurality of optical fiber transmission lines including respective cores arranged in a spaced array and wherein said optical fiber transmission lines are mutually separated by cladding type material.

23. The digital memory system of claim 22 and additionally including optical receiver/transducer means facing a forward end of said array and being responsive to light pulses coupled from an output end of said cores for generating electrical utilization signals.

* * * * *